United States Patent
Kuo et al.

(10) Patent No.: US 9,319,053 B2
(45) Date of Patent: Apr. 19, 2016

(54) PHASE-LOCKED LOOP (PLL)

(71) Applicant: Taiwan Semiconductor Manufacturing Company Limited, Hsin-Chu (TW)

(72) Inventors: Feng Wei Kuo, Zhudong Township (TW); Kuang-Kai Yen, Kaohsiung (TW); Huan-Neng Chen, Taichung (TW); Lee Tsung Hsiung, New Taipei (TW); Chewn-Pu Jou, Hsinchu (TW); Robert Bogdan Staszewski, Delft (NL)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 14/334,748

(22) Filed: Jul. 18, 2014

(65) Prior Publication Data

US 2016/0020776 A1    Jan. 21, 2016

(51) Int. Cl.
*H03L 7/06* (2006.01)
*H03L 7/099* (2006.01)

(52) U.S. Cl.
CPC .................................... *H03L 7/0991* (2013.01)

(58) Field of Classification Search
CPC ..................................................... H03L 7/0991
See application file for complete search history.

(56) References Cited

U.S. PATENT DOCUMENTS 6,658,748 B1    12/2003   Leipold et al.
2009/0262877 A1*  10/2009   Shi et al. .................... 375/376

OTHER PUBLICATIONS

A Low-Power All-Digital PLL Architecture Based on Phase Prediction, Jingcheng Zhuang et al., pp. 797-800.

\* cited by examiner

*Primary Examiner* — Daniel Puentes
(74) *Attorney, Agent, or Firm* — Cooper Legal Group, LLC

(57) ABSTRACT

A phase-locked loop (PLL) is provided. The PLL comprises a dithering circuit that is configured to receive a second tuning signal, and dither the second tuning signal to generate a dither signal to decrease a magnitude of a spur of the PLL. The dither signal is used by a digitally controlled oscillator (DCO) to generate an output signal of the PLL. Operation of the dithering circuit is controlled using a spur-cancel control circuit. The spur-cancel control circuit receives a frequency command word (FCW) signal and determines a value of an enable signal based on the FCW signal. In some embodiments, the dithering circuit dithers the second tuning signal based on the enable signal.

20 Claims, 4 Drawing Sheets

PHASE-LOCKED LOOP (PLL)

BACKGROUND

A phase-locked loop (PLL) is a control system that is configured to output a signal having a phase that is related to an input signal.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
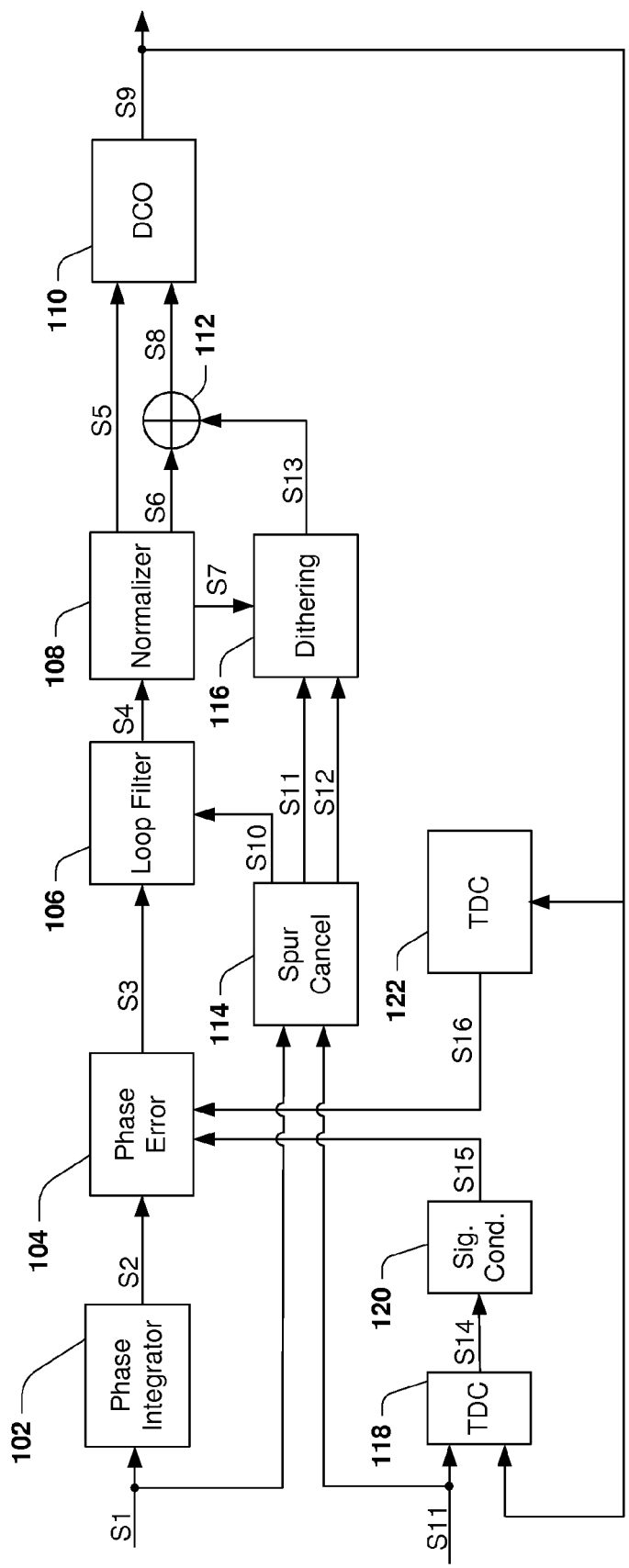
FIG. 1 is an illustration of a schematic block diagram of at least a portion of a phase-locked loop (PLL), in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In some embodiments, a phase-locked loop (PLL) is provided. In some embodiments, the PLL is an all-digital phase-locked loop (ADPLL). In some embodiments, the PLL is configured to generate an output clock signal having an output frequency substantially equal to a target frequency. In some embodiments, the target frequency is constant. In some embodiments, the target frequency changes from a first target frequency to a second target frequency, and the PLL is configured to change the output clock signal in accordance with the change to the target frequency. In some embodiments, the PLL is configured to change the output clock signal such that the output frequency is substantially equal to the second target frequency.

In some embodiments, a frequency command word (FCW) signal representing a FCW is received by a portion of the PLL. In some embodiments, the FCW corresponds to the target frequency. In some embodiments, a change of the FCW corresponds to a change to the target frequency. In some embodiments, the FCW is used by the PLL to calculate a reference phase related to the target frequency.

In some embodiments, a probability of occurrence of a periodic spur is a function of the FCW. In some embodiments, the periodic spur is caused by a periodic limit cycle of the PLL. In some embodiments, the FCW comprises a fractional part and an integer part. In some embodiments, the probability of occurrence of the periodic spur is a function of the fractional part. In some embodiments, the fractional part is greater than or equal to 0 and less than 1. In some embodiments, if a difference between the fractional part and 0 is less than a difference between the fractional part and 1, then the probability of occurrence of the periodic spur increases as the fractional part approaches 0. In some embodiments, if the difference between the fractional part and 1 is less than the difference between the fractional part and 0, then the probability of occurrence of the periodic spur increases as the fractional part approaches 1.

In some embodiments, if a difference between the fractional part and 0 is less than a difference between the fractional part and 1, then the probability of occurrence of the periodic spur decreases as the fractional part approaches 1. In some embodiments, if the difference between the fractional part and 1 is less than the difference between the fractional part and 0, then the probability of occurrence of the periodic spur decreases as the fractional part approaches 0. In some embodiments, if the fractional part is within a minimal occurrence range, then the probability of occurrence of the periodic spur is substantially equal to about 0. In some embodiments, the minimal occurrence range is between about 0.1 and about 0.9. In some embodiments, the minimal occurrence range is between about 0.2 and about 0.8.

FIG. 1 illustrates a schematic block diagram of a portion of a PLL, according to some embodiments. In some embodiments, the PLL comprises at least one of a phase integrator 102, a phase error circuit 104, a loop filter 106, a normalizer 108, a digitally controlled oscillator (DCO) 110, a tuning circuit 112, a spur-cancel control circuit 114, a dithering circuit 116, a first portion of a time-to-digital convertor (TDC) 118, a second portion of the TDC 122 or a signal conditioner 120.

In some embodiments, the phase integrator 102 receives a FCW signal S1. In some embodiments, the phase integrator 102 is configured to use the FCW signal S1 to determine a reference phase. In some embodiments, the DCO 110 is configured to output an output clock signal S9 such that there is a constant phase difference between an output phase of the output clock signal S9 and the reference phase. In some embodiments, the output clock signal S9 is an output signal of the PLL. In some embodiments, if there is a constant phase difference between the output phase and the reference phase, then the output clock signal S9 has an output frequency that is substantially equal to a target frequency of the PLL. In some embodiments, the phase difference is substantially equal to about 0 degrees. In some embodiments, the phase difference is substantially equal to a phase between about 0 degrees and about 360 degrees. In some embodiments, the phase integrator 102 outputs a reference phase signal S2 based on the reference phase.

In some embodiments, the first portion of the TDC 118 is configured to receive an initial clock signal S11 and the output clock signal S9. In some embodiments, the initial clock signal S11 is used by the first portion of the TDC 118 to coordinate one or more operations to generate a first output phase signal S14 representing an output phase fraction. In some embodiments, the output phase fraction is a calculation of a fractional part of the output phase. In some embodiments, the signal conditioner 120 receives the first output phase signal S14. In some embodiments, the signal conditioner 120 conditions the first output phase signal S14 to generate a conditioned first output phase signal S15. In some embodiments, the second portion of the TDC 122 is configured to receive the output clock signal S9. In some embodiments, the second portion of the TDC 122 is configured to generate a second output phase signal S16 representing an output phase integer. In some embodiments, the initial clock signal S11 is used by the second portion of the TDC 122 to coordinate one or more operations to generate the second output phase signal S16. In some embodiments, the output phase integer is a calculation of an integer part of the output phase.

In some embodiments, the phase error circuit 104 is configured to receive the reference phase signal S2, the conditioned first output phase signal S15 and the second output phase signal S16. In some embodiments, the phase error circuit 104 is configured to output a phase error signal S3 that represents a phase error. In some embodiments, the phase error corresponds to a difference between the output phase and the reference phase. In some embodiments, the phase error is substantially equal to the difference between the output phase and the reference phase. In some embodiments, the phase error circuit 104 is configured to subtract the output phase integer and the output phase fraction from the reference phase to determine the phase error. For example, when the output phase integer is about 17 degrees, the output phase fraction is about 0.7 degrees and the reference phase is about 20 degrees, the phase error is equal to about 20 degrees subtracted by a sum of about 17 degrees and about 0.7 degrees, which is about 2.3 degrees.

In some embodiments, the loop filter 106 is configured to receive the phase error signal S3 and a second modified clock signal S10. In some embodiments, the loop filter 106 is configured to generate a loop filter output signal. In some embodiments, the loop filter output signal is an oscillator tuning word (OTW) signal S4 digitally representing an OTW. In some embodiments, the OTW signal S4 is used by the DCO 110, such as after being normalized by the normalizer 108, to generate the output clock signal S9. In some embodiments, the OTW is a function of a parameter of the loop filter 106. In some embodiments, the OTW is a function of a loop gain. In some embodiments, the loop gain is a gain of the loop filter 106. In some embodiments, the loop gain is programmable. In some embodiments, the loop gain is adjustable. In some embodiments, the OTW increases when the loop gain increases. In some embodiments, the OTW decreases when the loop gain decreases.

In some embodiments, the normalizer 108 is configured to receive the OTW signal S4. In some embodiments, the normalizer 108 is configured to modify the OTW signal S4 to a normalized OTW signal. In some embodiments, based on the modifying the OTW signal S4, an effect of a gain of the DCO 110 on a loop bandwidth of the PLL is mitigated. In some embodiments, the loop bandwidth is a closed-loop bandwidth of the PLL. In some embodiments, the normalizer 108 is configured to undergo a process-voltage-temperature (PVT) variation mode of operation to modify the OTW signal S4 into a first normalized OTW signal S5. In some embodiments, the first normalized OTW signal S5 represents a first normalized OTW. In some embodiments, the normalizer 108 is configured to undergo a tracking mode of operation to modify the OTW signal S4 into a second normalized OTW signal S6 and a third normalized OTW signal S7. In some embodiments, the second normalized OTW signal S6 represents a second normalized OTW integer. In some embodiments, the second normalized OTW integer is an integer part of a second normalized OTW. In some embodiments, the third normalized OTW signal S7 represents a second normalized OTW fraction. In some embodiments, the second normalized OTW fraction is a fractional part of the second normalized OTW. In some embodiments, the second normalized OTW signal S6 is a first tuning signal. In some embodiments, the third normalized OTW signal S7 is a second tuning signal.

In some embodiments, when the target frequency changes, the normalizer 108 undergoes the PVT variation mode of operation for a first period of time. In some embodiments, the normalizer 108 does not undergo the tracking mode of operation during the first period of time. In some embodiments, after the first period of time, the normalizer 108 undergoes the tracking mode of operation for a second period of time. In some embodiments, the normalizer 108 does not undergo the PVT variation mode of operation during the second period of time. In some embodiments, the second period of time begins when the PLL is phase-locked. In some embodiments, the second period of time begins before the PLL is phase-locked. In some embodiments, the DCO 110 uses the first normalized OTW signal S5 during the first period of time. In some embodiments, the DCO 110 does not use the second normalized OTW signal S6 during the first period of time. In some embodiments, the DCO 110 does not use the third normalized OTW signal S7 during the first period of time. In some embodiments, the DCO 110 uses the second normalized OTW signal S6 during the second period of time. In some embodiments, the DCO 110 uses the third normalized OTW signal S7 during the second period of time. In some embodiments, the DCO 110 does not use the first normalized OTW signal S5 during the second period of time.

In some embodiments, the spur-cancel control circuit 114 is configured to receive the FCW signal S1 and the initial clock signal S11. In some embodiments, the spur-cancel control circuit 114 is configured to generate the second modified clock signal S10 based on at least one of the FCW signal S1 or the initial clock signal S11. In some embodiments, the spur-cancel control circuit 114 is configured to transmit the initial clock signal S11 to the dithering circuit 116. In some embodiments, the spur-cancel control circuit 114 is configured to generate an enable signal S12 based on at least one of the FCW signal S1 or the initial clock signal S11.

In some embodiments, the dithering circuit 116 is configured to receive the initial clock signal S11, the third normalized OTW signal S7 and the enable signal S12. In some embodiments, the dithering circuit 116 is configured to use the initial clock signal S11 to coordinate one or more operations to generate a dither signal S13. In some embodiments, the dithering circuit 116 is configured to dither the third normalized OTW signal S7 to the dither signal S13. In some embodiments, the dithering of the third normalized OTW signal S7 to the dither signal S13 decreases a magnitude of a spur of the PLL. In some embodiments, when the enable signal S12 has a first value, the dithering circuit 116 is configured to stop the dithering of the third normalized OTW signal S7 to the dither signal S13. In some embodiments, when the enable signal S12 has a second value, the dithering circuit 116 is configured to start the dithering of the third normalized OTW signal S7 to the dither signal S13. In some embodiments, when the enable signal has the first value, the dithering circuit 116 is configured to maintain the third normalized OTW signal S7. In some embodiments, when the enable signal has the first value, the dithering circuit 116 is configured to not dither the third normalized OTW signal S7. In some embodiments, when the enable signal has the first value, the third normalized OTW signal S7 and the dither signal S13 are substantially equivalent. In some embodiments, when the enable signal has the second value, the dithering circuit 116 is configured to dither the third normalized OTW signal S7.

In some embodiments, the tuning circuit 112 is a combinational circuit. In some embodiments, the tuning circuit 112 is configured to receive the second normalized OTW signal S6 and the dither signal S13. In some embodiments, the tuning circuit 112 is configured to sum the second normalized OTW signal S6 and the dither signal S13, and is configured to generate a fourth normalized OTW signal S8 representing a sum of the second normalized OTW signal S6 and the dither signal S13. In some embodiments, the fourth normalized OTW signal S8 represents the second normalized OTW. In some embodiments, the fourth normalized OTW signal S8 is a DCO input signal. In some embodiments, the fourth normalized OTW signal S8 is received by the DCO 110. In some embodiments, the DCO 110 uses the fourth normalized OTW signal S8 during the second period of time to generate the output clock signal S9. In some embodiments, the DCO 110 does not use the fourth normalized OTW signal S8 during the first period of time.

Figure 2:
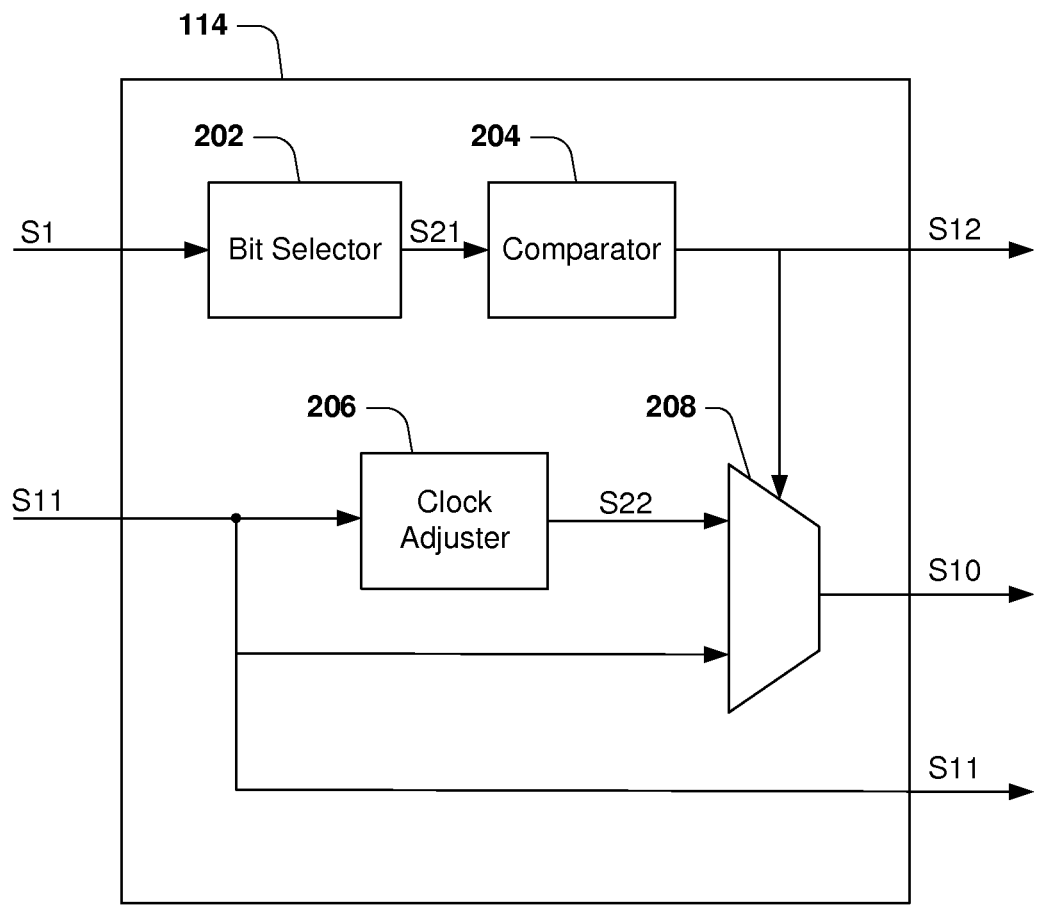
FIG. 2 is an illustration of a schematic block diagram of at least a portion of a spur-cancel control circuit, in accordance with some embodiments.

FIG. 2 illustrates a schematic block diagram of the spur-cancel control circuit 114, according to some embodiments. In some embodiments, the spur-cancel control circuit 114 comprises a bit selector 202, a comparator 204, a clock adjuster 206 and a multiplexer 208. In some embodiments, the bit selector 202 is configured to receive the FCW signal S1. In some embodiments, the bit selector 202 is configured to modify the FCW signal S1 to generate a modified FCW signal S21 representing a fractional part of a FCW represented by the FCW signal S1. In some embodiments, the fractional part of the FCW is greater than or equal to 0 and less than 1.

In some embodiments, the comparator 204 is configured to receive the modified FCW signal S21. In some embodiments, the comparator 204 is configured to generate the enable signal S12 based on the modified FCW signal S21. In some embodiments, the comparator 204 is configured to generate the enable signal S12 having the first value when the fractional part of the FCW is within a specified range. In some embodiments, a probability of occurrence of a periodic spur caused by a periodic limit cycle of the PLL when the fractional part is within the specified range is less than the probability of occurrence of the periodic spur when the fractional part is outside the specified range. In some embodiments, the specified range is between about 0.1 and about 0.9. In some embodiments, the specified range is between about 0.2 and about 0.8. In some embodiments, the comparator 204 is configured to generate the enable signal S12 having the second value when the fractional part of the FCW is outside the specified range. In some embodiments, the first value is equal to 0. In some embodiments, the second value is equal to 1. In some embodiments, the first value is equal to a number other than 0. In some embodiments, the second value is equal to a number other than 1.

In some embodiments, the clock adjuster 206 is configured to receive the initial clock signal S11 having an initial frequency. In some embodiments, the clock adjuster 206 is configured to modify the initial clock signal S11 to a modified clock signal S22 having a modified frequency. In some embodiments, the modified frequency corresponds to a first frequency. In some embodiments, the first frequency is substantially equal to the initial frequency. In some embodiments, the modified frequency is programmable. In some embodiments, the modified frequency is adjustable. In some embodiments, the modified frequency changes from the first frequency to a second frequency. In some embodiments, the second frequency is greater than the first frequency. In some embodiments, the second frequency is less than the first frequency. In some embodiments, the second frequency is equal to the initial frequency divided by a specified divisor.

In some embodiments, the multiplexer 208 is configured to receive the initial clock signal S11, the enable signal S12 and the modified clock signal S22. In some embodiments, the multiplexer 208 is configured to generate the second modified clock signal S10 based on at least one of the initial clock signal S11, the enable signal S12 or the modified clock signal S22. In some embodiments, the multiplexer 208 is configured to transmit the modified clock signal S22 to generate the second modified clock signal S10 having the modified frequency when the enable signal S12 has the first value. In some embodiments, the multiplexer 208 is configured to transmit the initial clock signal S11 to generate the second modified clock signal S10 having the initial frequency when the enable signal S12 has the second value.

Figure 3:
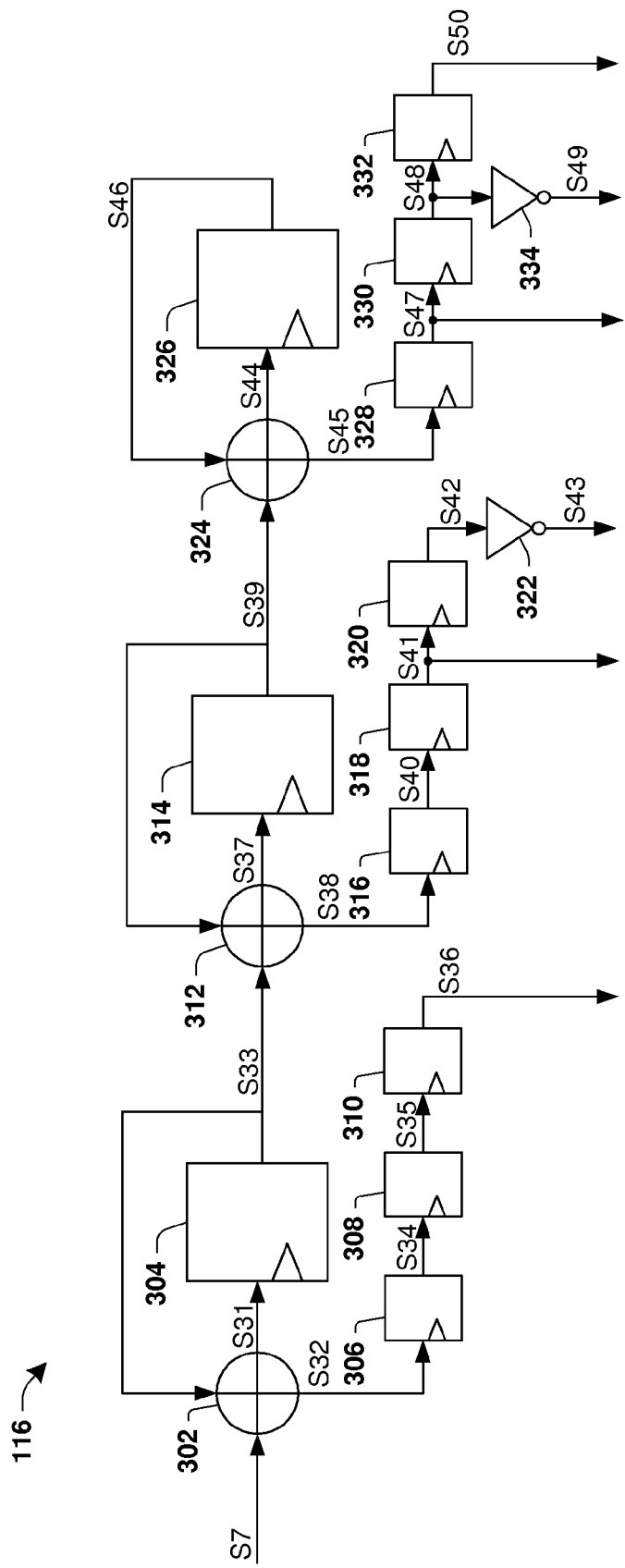
FIG. 3 is an illustration of a schematic block diagram of at least a portion of a dithering circuit, in accordance with some embodiments.

FIG. 3 illustrates a schematic block diagram of a portion of the dithering circuit 116, according to some embodiments. In some embodiments, the dithering circuit 116 comprises a plurality of flip-flops, a first combinational circuit 302, a second combinational circuit 312, a third combinational circuit 324, a first inverter 322 and a second inverter 334. In some embodiments, the plurality of flip-flops is configured to use the initial clock signal S11 to coordinate one or more operations. In some embodiments, a flip-flop within the plurality of flip-flops is configured to receive an input signal and generate an output signal corresponding to a delay of the input signal. In some embodiments, the plurality of flip-flops comprises a first flip-flop 304, a second flip-flop 306, a third flip-flop 308, a fourth flip-flop 310, a fifth flip-flop 314, a sixth flip-flop 316, a seventh flip-flop 318, an eighth flip-flop 320, a ninth flip-flop 326, a tenth flip-flop 328, an eleventh flip-flop 330 and a twelfth flip-flop 332. In some embodiments, at least one of the first flip-flop 304, the second flip-flop 306, the third flip-flop 308, the fourth flip-flop 310, the fifth flip-flop 314, the sixth flip-flop 316, the seventh flip-flop 318, the eighth flip-flop 320, the ninth flip-flop 326, the tenth flip-flop 328, the eleventh flip-flop 330 or the twelfth flip-flop 332 is a JK flip-flop.

In some embodiments, the first combinational circuit 302 is configured to receive the third normalized OTW signal S7 and a first flip-flop output signal S33. In some embodiments, the third normalized OTW signal S7 comprises a plurality of bits. In some embodiments, a number of bits comprised by the plurality of bits is equal to a specified number of bits. In some embodiments, the plurality of bits of the third normalized OTW signal S7 is transmitted using a plurality of channels in parallel. In some embodiments, a number of channels comprised by the plurality of channels is equal to a specified number of channels. In some embodiments, the specified number of channels is equal to the specified number of bits. In some embodiments, the specified number of bits is equal to 8. In some embodiments, the specified number of bits is less than 8. In some embodiments, the specified number of bits is greater than 8.

In some embodiments, the first flip-flop output signal S33 has a plurality of bits. In some embodiments, a number of bits comprised by the plurality of bits of the first flip-flop output signal S33 is equal to the specified number of bits. In some embodiments, the plurality of bits of the first flip-flop output signal S33 is transmitted using a plurality of channels in parallel. In some embodiments, a number of channels comprised by the plurality of channels is equal to the specified number of channels. In some embodiments, the first combinational circuit 302 is configured to sum the third normalized OTW signal S7 and the first flip-flop output signal S33 to calculate a first sum. In some embodiments, the first sum has a plurality of bits, with a number of bits comprised by the plurality of bits of the first sum equal to a sum of the specified number of bits and 1.

In some embodiments, the first combinational circuit 302 is configured to generate a first combinational circuit signal S31 having a first portion of the first sum. In some embodiments, the first combinational circuit signal S31 is received by the first flip-flop 304. In some embodiments, the first flip-flop 304 is configured to use the first combinational circuit signal S31 to generate the first flip-flop output signal S33. In some embodiments, the first combinational circuit 302 is configured to generate a first combinational circuit carryout signal S32 having a second portion of the first sum. In some embodiments, the first portion of the first sum represents the plurality of bits of the first sum excluding a carryout bit of the plurality of bits of the first sum. In some embodiments, the second portion of the first sum represents the carryout bit of the plurality of bits of the first sum. In some embodiments, the first combinational circuit carryout signal S32 is received by the second flip-flop 306.

In some embodiments, the second flip-flop 306 is configured to generate a second flip-flop output signal S34 based on the first combinational circuit carryout signal S32. In some embodiments, the third flip-flop 308 is configured to receive the second flip-flop output signal S34. In some embodiments, the third flip-flop 308 is configured to generate a third flip-flop output signal S35 based on the second flip-flop output signal S34. In some embodiments, the fourth flip-flop 310 is configured to receive the third flip-flop output signal S35. In some embodiments, the fourth flip-flop 310 is configured to generate a fourth flip-flop output signal S36 based on the third flip-flop output signal S35.

In some embodiments, the second combinational circuit 312 is configured to receive the first flip-flop output signal S33 and a fifth flip-flop output signal S39. In some embodiments, the second combinational circuit 312 is configured to sum the first flip-flop output signal S33 and the fifth flip-flop output signal S39 to calculate a second sum. In some embodiments, the second sum has a plurality of bits, with a number of bits comprised by the plurality of bits of the second sum equal to a sum of the specified number of bits and 1. In some embodiments, the second combinational circuit 312 is configured to generate a second combinational circuit signal S37 having a first portion of the second sum.

In some embodiments, the second combinational circuit signal S37 is received by the fifth flip-flop 314. In some embodiments, the fifth flip-flop 314 is configured to use the second combinational circuit signal S37 to generate the fifth flip-flop output signal S39. In some embodiments, the second combinational circuit 312 is configured to generate a second combinational circuit carryout signal S38 having a second portion of the second sum. In some embodiments, the first portion of the second sum represents the plurality of bits of the second sum excluding a carryout bit of the plurality of bits of the second sum. In some embodiments, the second portion of the second sum represents the carryout bit of the plurality of bits of the second sum.

In some embodiments, the second combinational circuit carryout signal S38 is received by the sixth flip-flop 316. In some embodiments, the sixth flip-flop 316 is configured to generate a sixth flip-flop output signal S40 based on the second combinational circuit carryout signal S38. In some embodiments, the seventh flip-flop 318 is configured to receive the sixth flip-flop output signal S40. In some embodiments, the seventh flip-flop 318 is configured to generate a seventh flip-flop output signal S41 based on the sixth flip-flop output signal S40. In some embodiments, the eighth flip-flop 320 is configured to receive the seventh flip-flop output signal S41. In some embodiments, the eighth flip-flop 320 is configured to generate an eighth flip-flop output signal S42 based on the seventh flip-flop output signal S41. In some embodiments, the first inverter 322 is configured to receive the eighth flip-flop output signal S42. In some embodiments, the first inverter 322 is configured to generate a first inverter signal S43 based on the eighth flip-flop output signal S42. In some embodiments, the first inverter signal S43 corresponds to an inversion of the eighth flip-flop output signal S42.

In some embodiments, the third combinational circuit 324 is configured to receive the fifth flip-flop output signal S39 and a ninth flip-flop output signal S46. In some embodiments, the third combinational circuit 324 is configured to sum the fifth flip-flop output signal S39 and the ninth flip-flop output signal S46 to calculate a third sum. In some embodiments, the third sum has a plurality of bits, with a number of bits comprised by the plurality of bits of the third sum equal to a sum of the specified number of bits and 1. In some embodiments, the third combinational circuit 324 is configured to generate a third combinational circuit signal S44 having a first portion of the third sum. In some embodiments, the third combinational circuit signal S44 is received by the ninth flip-flop 326.

In some embodiments, the ninth flip-flop 326 is configured to use the third combinational circuit signal S44 to generate the ninth flip-flop output signal S46. In some embodiments, the third combinational circuit 324 is configured to generate a third combinational circuit carryout signal S45 having a second portion of the third sum. In some embodiments, the first portion of the third sum represents a plurality of bits of the third sum excluding a carryout bit of the plurality of bits of the third sum. In some embodiments, the second portion of the third sum represents the carryout bit of the plurality of bits of the third sum. In some embodiments, the third combinational circuit carryout signal S45 is received by the tenth flip-flop 328.

In some embodiments, the tenth flip-flop 328 is configured to generate a tenth flip-flop output signal S47 based on the third combinational circuit carryout signal S45. In some embodiments, the eleventh flip-flop 330 is configured to receive the tenth flip-flop output signal S47. In some embodiments, the eleventh flip-flop 330 is configured to generate an eleventh flip-flop output signal S48 based on the tenth flip-flop output signal S47. In some embodiments, the twelfth flip-flop 332 is configured to receive the eleventh flip-flop output signal S48. In some embodiments, the twelfth flip-flop 332 is configured to generate a twelfth flip-flop output signal S50 based on the eleventh flip-flop output signal S48. In some embodiments, the second inverter 334 is configured to receive the eleventh flip-flop output signal S48. In some embodiments, the second inverter 334 is configured to generate a second inverter signal S49 based on the eleventh flip-flop output signal S48. In some embodiments, the second inverter signal S49 corresponds to an inversion of the eleventh flip-flop output signal S48.

In some embodiments, the dithering circuit 116 comprises a configuration of variable capacitors. In some embodiments, the configuration of variable capacitors comprises a plurality of variable capacitors connected to a plurality of inductors. In some embodiments, the configuration of variable capacitors is configured to receive the fourth flip-flop output signal S36, the seventh flip-flop output signal S41, the first inverter signal S43, the tenth flip-flop output signal S47, the second inverter signal S49 and the twelfth flip-flop output signal S50. In some embodiments, the configuration of variable capacitors is configured to generate the dither signal S13 shown in FIG. 1 based on one or more of the fourth flip-flop output signal S36, the seventh flip-flop output signal S41, the first inverter signal S43, the tenth flip-flop output signal S47, the second inverter signal S49 or the twelfth flip-flop output signal S50.

Figure 4:
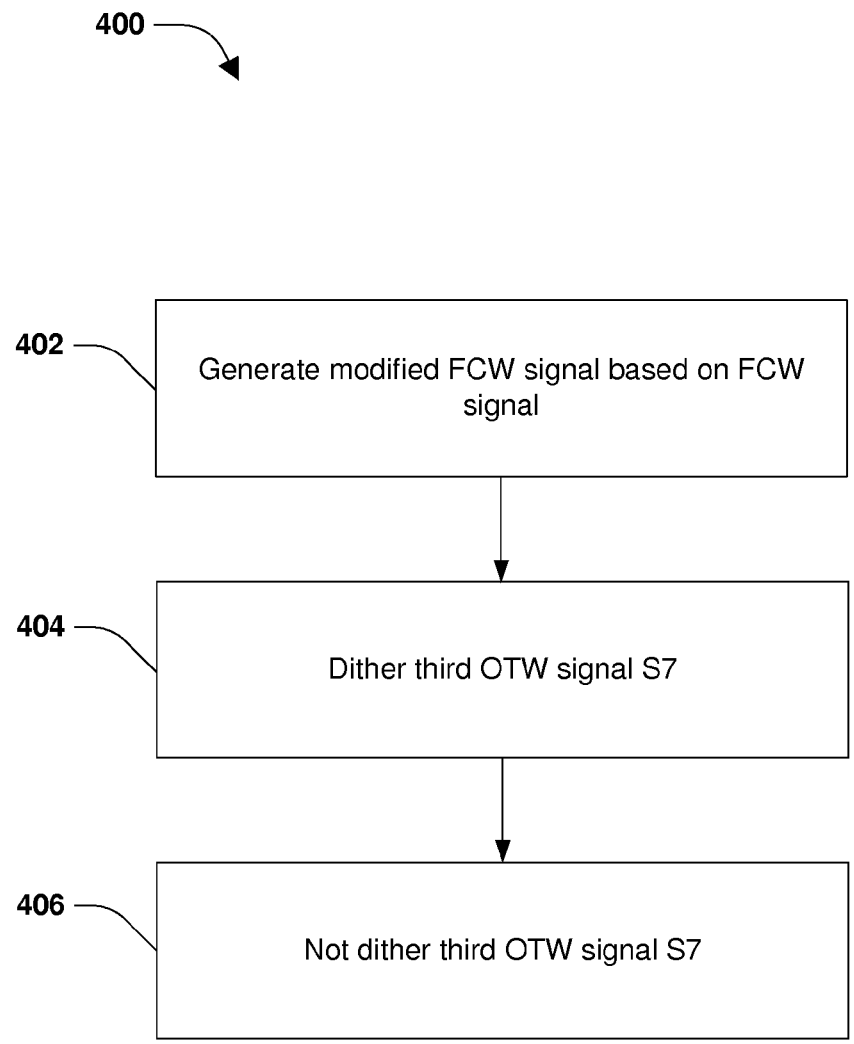
FIG. 4 illustrates a method of operating a PLL, in accordance with some embodiments.

A method 400 of operating a PLL is illustrated in FIG. 4, according to some embodiments. In some embodiments, at 402, the bit selector 202 is configured to generate the modified FCW signal S21 based on the FCW signal S1. In some embodiments, the modified FCW signal S21 represents the fractional part of the FCW represented by the FCW signal S1. In some embodiments, at 404, responsive to the fractional part of the FCW being outside the specified range, the dithering circuit 116 dithers the third normalized OTW signal S7. In some embodiments, the third normalized OTW signal S7 is used by the DCO 110 to generate an output signal having an output frequency. In some embodiments, the output signal generated by the DCO 110 is the output clock signal S9. In some embodiments, at 406, responsive to the fractional part of the FCW being within the specified range, the dithering circuit 116 does not dither the third normalized OTW signal S7.

In some embodiments, a PLL is provided comprising a dithering circuit and a DCO. In some embodiments, the dithering circuit is configured to receive a second tuning signal. In some embodiments, the dithering circuit is configured to dither the second tuning signal to generate a dither signal. In some embodiments, the DCO is configured to receive a DCO input signal based on at least one of the dither signal or a first tuning signal. In some embodiments, the DCO is configured to generate an output signal having an output frequency based on the DCO input signal.

In some embodiments, a PLL is provided comprising a spur-cancel control circuit, a dithering circuit and a DCO. In some embodiments, the spur-cancel control circuit is configured to receive a FCW signal. In some embodiments, the spur-cancel control circuit is configured to generate an enable signal based on the FCW signal. In some embodiments, the dithering circuit is configured to receive a second tuning signal and the enable signal. In some embodiments, the dithering circuit is configured to dither the second tuning signal based on the enable signal to generate a dither signal. In some embodiments, the DCO is configured to receive a DCO input signal based on at least one of the dither signal or a first tuning signal. In some embodiments, the DCO is configured to generate an output signal having an output frequency based on the DCO input signal.

In some embodiments, a method for operating a PLL is provided. In some embodiments, the method comprises generating a modified FCW signal based on a FCW signal. In some embodiments, the method comprises responsive to determining that a modified FCW represented by the modified FCW signal is outside a first range, dithering a second tuning signal used by a DCO to generate an output signal having an output frequency.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:
1. A phase-locked loop (PLL), comprising:
    a dithering circuit configured to:
        receive a first tuning signal; and
        dither the first tuning signal to generate a dither signal;
    a tuning circuit comprising an adder configured to generate a digitally controlled oscillator (DCO) input signal based upon a combination of the dither signal and a second tuning signal; and
    a DCO configured to:
        receive the DCO input signal generated based on the dither signal and the second tuning signal; and generate an output signal having an output frequency based on the DCO input signal.

2. The PLL of claim 1, comprising a phase error circuit configured to:
receive a reference phase signal representing a reference phase;
receive a first output phase signal representing a fractional part of an output phase of the output signal;
receive a second output phase signal representing an integer part of the output phase; and
output a phase error signal based on at least one of the reference phase signal, the first output phase signal or the second output phase signal.

3. The PLL of claim 2, the phase error circuit comprising a subtractor configured to subtract the fractional part of the output phase and the integer part of the output phase from the reference phase to generate the phase error signal.

4. A phase-locked loop (PLL), comprising:
a spur-cancel control circuit comprising:
a bit selector configured to:
receive a frequency command word (FCW) signal; and
generate a modified FCW signal representing a fractional part of a FCW represented by the FCW signal; and
a comparator configured to generate an enable signal based on the modified FCW signal;
a dithering circuit configured to:
receive a first tuning signal and the enable signal; and
dither the first tuning signal based on the enable signal to generate a dither signal; and
a digitally controlled oscillator (DCO) configured to:
receive a DCO input signal generated based on at least one of the dither signal or a second tuning signal; and
generate an output signal having an output frequency based on the DCO input signal.

5. The PLL of claim 4, the dithering circuit configured to stop the dithering when the enable signal has a first value.

6. The PLL of claim 4, the dithering circuit configured to start the dithering when the enable signal has a second value.

7. The PLL of claim 4, the spur-cancel control circuit comprising at least one of a clock adjuster or a multiplexer.

8. The PLL of claim 4, the comparator configured to:
receive the modified FCW signal; and
generate the enable signal such that the enable signal has a first value when a fractional part of the FCW is within a first range and the enable signal has a second value when the fractional part of the FCW is outside the first range.

9. The PLL of claim 4, comprising a clock adjuster configured to:
receive an initial clock signal having an initial frequency; and
modify the initial clock signal to a modified clock signal having a modified frequency.

10. The PLL of claim 9, the modified frequency corresponding to the initial frequency divided by a specified divisor.

11. The PLL of claim 10, the specified divisor changeable from a first specified divisor to a second specified divisor.

12. The PLL of claim 9, comprising a multiplexer configured to:
receive at least one of the enable signal, the modified clock signal or the initial clock signal; and
generate a second modified clock signal having a second modified frequency that corresponds to the modified frequency when the enable signal has a first value and having the initial frequency when the enable signal has a second value.

13. The PLL of claim 4, the dithering circuit comprising at least one of one or more flip-flops or one or more adders.

14. A phase-locked loop (PLL), comprising:
a phase error circuit comprising a subtractor and configured to:
receive a reference phase signal representing a reference phase;
receive a first output phase signal representing a fractional part of an output phase of an output signal;
receive a second output phase signal representing an integer part of the output phase; and
subtract the fractional part of the output phase and the integer part of the output phase from the reference phase to generate a phase error signal;
a dithering circuit configured to:
receive a first tuning signal generated based on the phase error signal; and
dither the first tuning signal to generate a dither signal; and
a digitally controlled oscillator (DCO) configured to:
receive a DCO input signal generated based on at least one of the dither signal or a second tuning signal; and
generate the output signal having an output frequency based on the DCO input signal.

15. The PLL of claim 14, comprising:
a tuning circuit comprising an adder configured to generate the DCO input signal based upon a combination of the dither signal and the second tuning signal.

16. A phase-locked loop (PLL), comprising:
a spur-cancel control circuit comprising:
a clock adjuster configured to:
receive an initial clock signal having an initial frequency; and
modify the initial clock signal to a first modified clock signal having a modified frequency;
a multiplexer configured to:
receive an enable signal generated based on a frequency command word (FCW) signal;
receive the first modified clock signal;
receive the initial clock signal; and
generate a second modified clock signal having the modified frequency when the enable signal has a first value and having the initial frequency when the enable signal has a second value;
a dithering circuit configured to:
receive a first tuning signal and the enable signal; and
dither the first tuning signal based on the enable signal to generate a dither signal; and
a digitally controlled oscillator (DCO) configured to:
receive a DCO input signal generated based on at least one of the dither signal or a second tuning signal; and
generate an output signal having an output frequency based on the DCO input signal.

17. The PLL of claim 16, the spur-cancel control circuit comprising:
a bit selector configured to:
receive the FCW signal; and
generate a modified FCW signal representing a fractional part of a FCW represented by the FCW signal; and
a comparator configured to generate the enable signal based on the modified FCW signal.

18. The PLL of claim 17, the comparator configured to:
receive the modified FCW signal; and generate the enable signal such that the enable signal has a first value when the fractional part of the FCW is within a first range and the enable signal has a second value when the fractional part of the FCW is outside the first range.

19. The PLL of claim 16, the modified frequency corresponding to the initial frequency divided by a specified divisor.

20. The PLL of claim 16, comprising an adder configured to generate the DCO input signal based upon a combination of the dither signal and the second tuning signal.

* * * * *